United States Patent [19]

Fukushi et al.

[11] Patent Number: 4,757,474
[45] Date of Patent: Jul. 12, 1988

[54] SEMICONDUCTOR MEMORY DEVICE HAVING REDUNDANCY CIRCUIT PORTION

[75] Inventors: Isao Fukushi, Yokohama; Yasuhiko Maki, Kawasaki, both of Japan

[73] Assignee: Fujitsu Limited, Kawasaki, Japan

[21] Appl. No.: 11,268

[22] Filed: Jan. 21, 1987

[30] Foreign Application Priority Data

Jan. 28, 1986 [JP] Japan ................. 61-016050
Feb. 18, 1986 [JP] Japan ................. 61-031942

[51] Int. Cl.$^4$ ............................................. G11C 11/40
[52] U.S. Cl. ..................................... 365/189; 365/210
[58] Field of Search ............ 365/189, 182, 230, 207, 365/210

[56] References Cited

U.S. PATENT DOCUMENTS 4,051,354 9/1977 Choate ............................ 365/189
4,380,066 4/1983 Spencer et al. .

FOREIGN PATENT DOCUMENTS 0034070 8/1981 European Pat. Off. .
0032957 8/1981 European Pat. Off. .
0049629 4/1982 European Pat. Off. .
0054692 6/1982 European Pat. Off. .
0058948 9/1982 European Pat. Off. .
0118583 9/1984 European Pat. Off. .
2646163 11/1979 Fed. Rep. of Germany .
3226033 2/1983 Fed. Rep. of Germany .

OTHER PUBLICATIONS

Bipolar-Transistor Type Semiconductor Memory Device Having Redundancy Configuration, Tomoharu Awaya et al., U.S. Ser. No. 788,587, filed 10/17/85.
Bipolar-Transistor Type Random Access Memory Device Having Redundancy Configuration, Isao Fukushi et al., U.S. Ser. No. 788,458, filed 10/17/85.

Primary Examiner—Terrell W. Fears
Attorney, Agent, or Firm—Staas & Halsey

[57] ABSTRACT

A semiconductor memory device includes a redundancy circuit having upper address bit input terminals receiving upper address bit, lower address bit input terminals receiving lower address bits, a regular memory cell array having a plurality of word lines and bit lines, and a plurality of memory cells are arranged at each intersection of the word and bit lines. A redundancy memory cell array is provided having a plurality of word and bit lines, and a plurality of memory cells are arranged at each intersection of the word and bit lines. The capacity of the redundancy memory cell array being smaller than the regular memory cell array. A first selection circuit selects a word or bit line in the regular memory cell array in accordance with the upper and lower address bits. A second selection circuit select a word or bit line in the redundancy memory cell array in accordance with the lower address bits. A redundancy address programming circuit programs the upper address bits corresponding to defective memory cells in the regular memory cell array. A control circuit compares the input upper address bits with the programmed upper address bits and controls the first and second selection circuits to inhibit the selection of the word or bit lines in the regular memory cell array. A predetermined word or bit line in the redundancy memory cell array is selected therefor when each of the input upper address bits coincides with each of the programmed upper address bits.

5 Claims, 9 Drawing Sheets

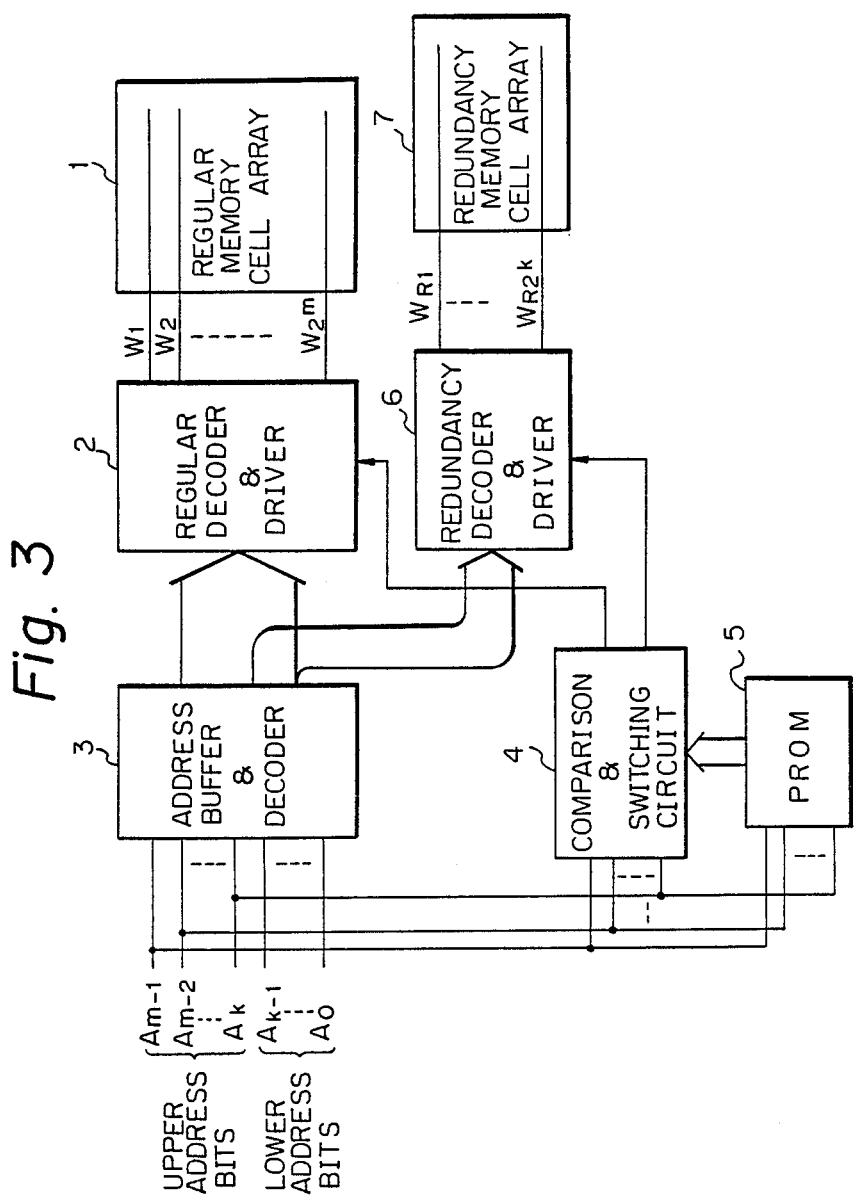

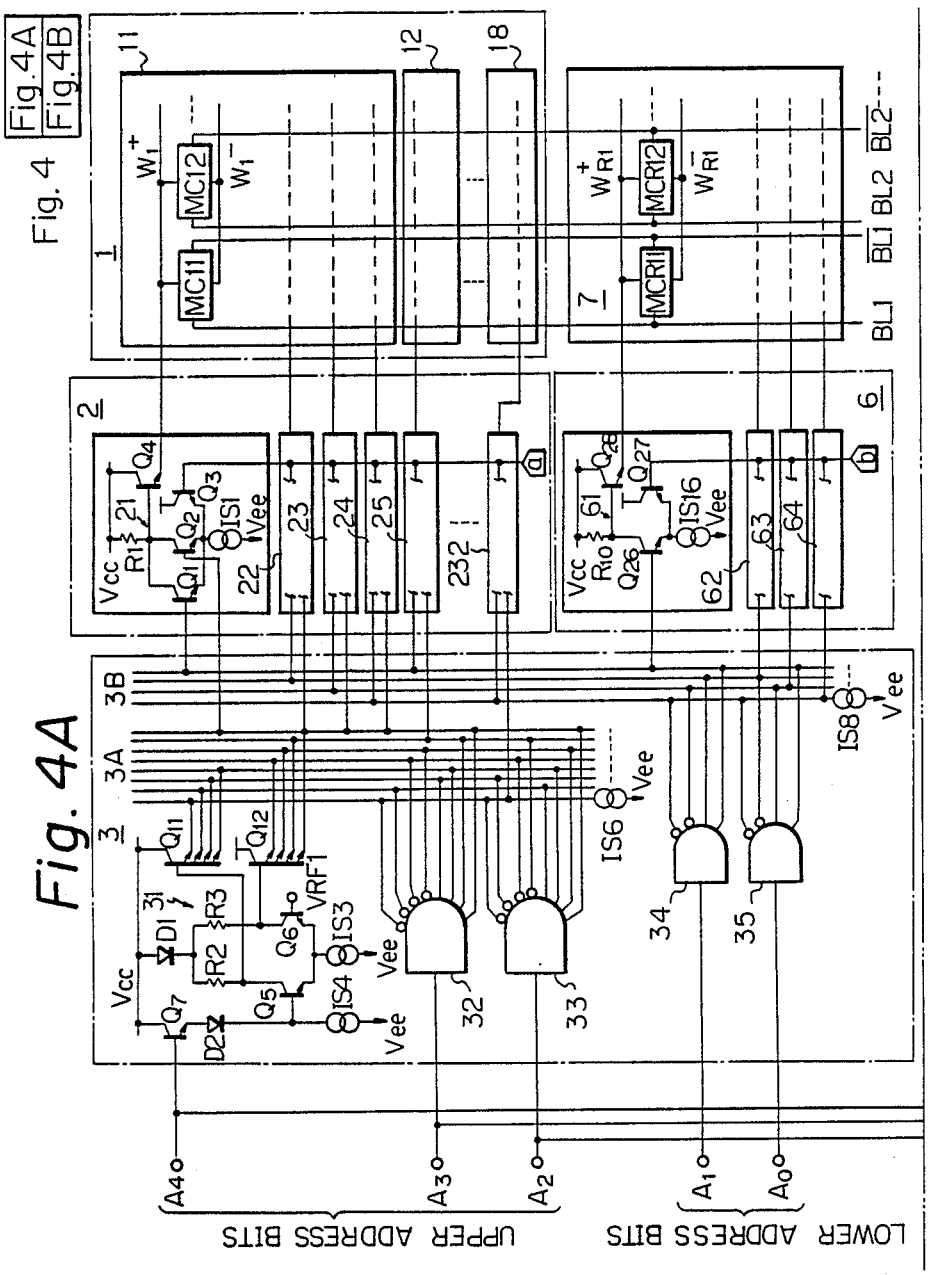

WHEN SELECTING REGULAR MEMORY CELL ARRAY I

WHEN SELECTING REDUNDANCY MEMORY CELL ARRAY 7

WHEN SELECTING REGULAR MEMORY CELL ARRAY I

WHEN SELECTING REDUNDANCY MEMORY CELL ARRAY 7

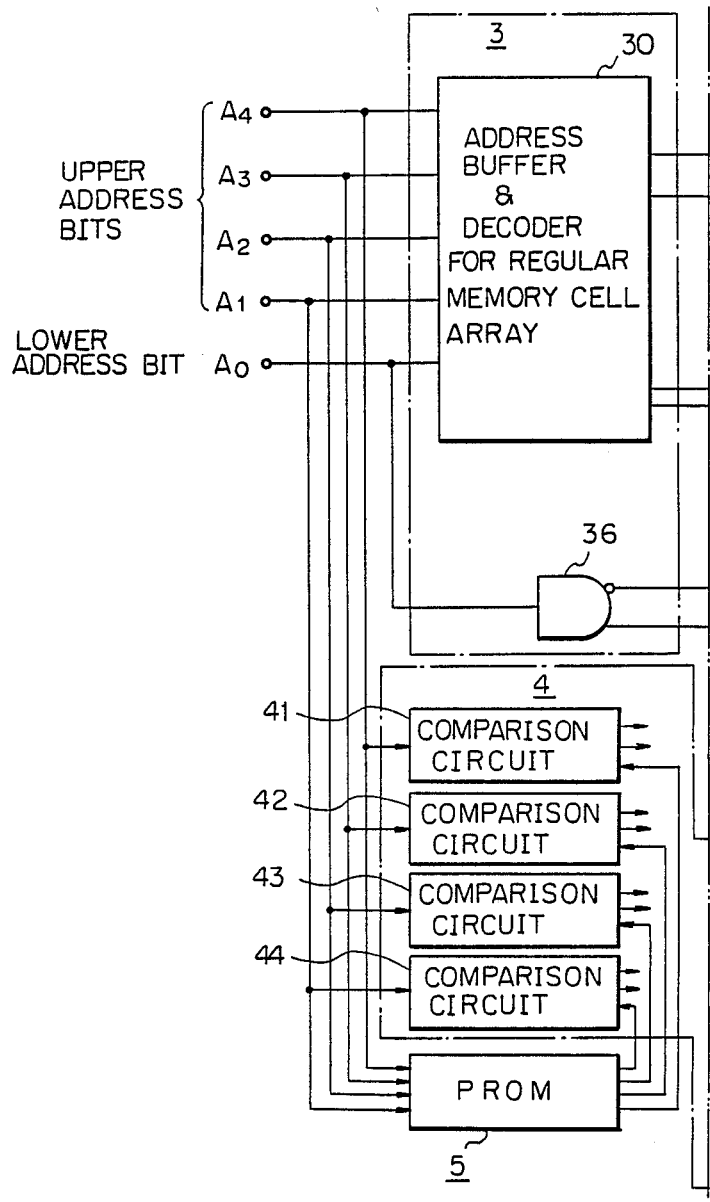

SEMICONDUCTOR MEMORY DEVICE HAVING REDUNDANCY CIRCUIT PORTION

BACKGROUND OF THE INVENTION

1. Field of the Invention

The present invention relates to a semiconductor memory device. More particularly, it relates to a bipolar-transistor type semiconductor memory device having a redundancy circuit portion for replacing a defective circuit portion such as a defective memory cell existing in a regular memory cell array.

2. Description of the Related Art

Generally, a conventional semiconductor memory device having a redudancy circuit portion for replacing a defective circuit portion such as a defective memory cell comprises an address buffer and decoder, a regular decoder and driver, a regular memory cell array, a comparison and switching circuit, a programmable read only memory (PROM), a redundancy decoder and driver, and a redundancy memory cell array. If a defective memory cell is detected by carrying out the test for the regular memory cell array during the production process of the memory device, all address bit signals (for example, row address bit signals) constructing the address data corresponding to the defective memory cell are preliminarily programmed in the PROM.

Thus, when predetermined address bit signals (in this case, row address bit signals) are input to the address buffer and decoder in order to carry out a write operation or read operation, the input address bit signals are compared with the above programmed address bit signals in order to detect whether or not each logic of the corresponding address bit signal coincides, by using the comparison and switching circuit. If, as a result of the above comparison, it is detected that at least one logic of the input address bit signals does not coincide with that of the corresponding programmed address bit signal, the regular decoder and driver carries out the decoding operation in accordance with the input row address bit signals supplied through the address buffer and decoder, and as a result, a predetermined word line is selected in accordance with the input row address bit signals from a plurality of word lines arranged in the regular memory cell array through the regular decoder and driver.

Conversely, if it is detected that each logic of the input address bit signals coincides with that of the corresponding programmed address bit signal, the comparison and switching circuit outputs the control signal so as to inhibit the decoding operation of the regular decoder and driver and to enter the redundancy decoder and driver into an active state. As a result, a redundancy word line arranged in the redundancy memory cell array is selected through the redundancy decoder and driver, instead of the predetermined word line corresponding to the input row address bit signals arranged in the regular memory cell array.

However, in the above conventional memory device, it is possible to select only one redundancy word line, instead of one word line to which the defective memory cell is connected, by providing the PROM in which all address bit signals constructing the row address data corresponding to the above defective memory cell are programmed. Therefore if it is desired to increase the number of the redundancy word lines in order to prevent the selection of each of several word lines to which a number of defective memory cells are connected, it is necessary to increase the number of the PROMs. In the PROMs, all address bit signals constructing a plurality of row address data corresponding to the defective memory cells are programmed, and the number of the comparison circuits for comparing each logic of the input address bit signal with that of the corresponding programmed address bit signal. Thus, a problem arises in that the total capacity of the device is increased, and accordingly, the entire structure of the increased comparison circuits also becomes large, particularly when the number of the address bit signals constructing each address data is increased. Further the number of the redundancy word lines or redundancy bit lines to be selected instead of the regular word lines or regular bit lines to which the defective memory cells are connected is increased.

SUMMARY OF THE INVENTION

The present invention is intended to solve the above problem, and the object of the present invention is to provide a semiconductor memory device having a redundancy memory cell array in which a predetermined number of redundancy word lines or bit lines are provided so as to be selected instead of each of several word lines or bit lines to which a number of defective memory cells are connected, without making the capacity of the PROM and the entire structure of the comparison circuits too large.

To attain the above-mentioned object, according to the present invention, there is provided a semiconductor memory device including one or more upper address bit input terminals through which one or more upper address bits are input; one or more lower address bit input terminals through which one or more lower address bits are input; a regular memory cell array in which a plurality of word lines and bit lines are provided, and a plurality of memory cells are arranged at each intersection of the word lines and bit lines; a redundancy memory cell array in which a plurality of word lines and bit lines are provided, and a plurality of memory cells are arranged at each intersection of the word lines and bit lines, the capacity of the redundancy memory cell array being smaller than that of the regular memory cell array; a first selection means for selecting a word line or bit line belonging to the regular memory cell array in accordance with the upper address bits and lower address bits; a second selection means for selecting a word line or bit line belonging to the redundancy memory cell array in accordance with the lower address bits; a redundancy address programming means for programming one or more upper address bits included in address data corresponding to a defective memory cell existing in the regular memory cell array; and control means for comparing each of the input upper address bits with each of the programmed upper address bits and for controlling the first and second selection means so that the selection of the word line or bit line belonging to the regular memory cell array is inhibited and a predetermined word line or bit line belonging to the redundancy memory cell array is selected instead of the word line or bit line belonging to the regular memory cell array, when each of the input upper address bits coincides with each of the programmed upper address bits.

Thus, according to the present invention, it is possible to provide a semiconductor memory device having a redundancy memory cell array in which one of a predetermined number of redundancy word lines or bit lines is selected instead of each of several regular word lines or bit lines in accordance with the input lower address bits when each of the input upper address bits coincides with each of the programmed upper address bits. As a result, it is possible to prevent the capacity of the programming means and the entire structure of the control means from becoming too large.

BRIEF DESCRIPTION OF THE DRAWINGS

FIG. 3 is a block diagram of a semiconductor memory device according to the present invention;

DESCRIPTION OF THE PREFERRED EMBODIMENTS

Figure 1:
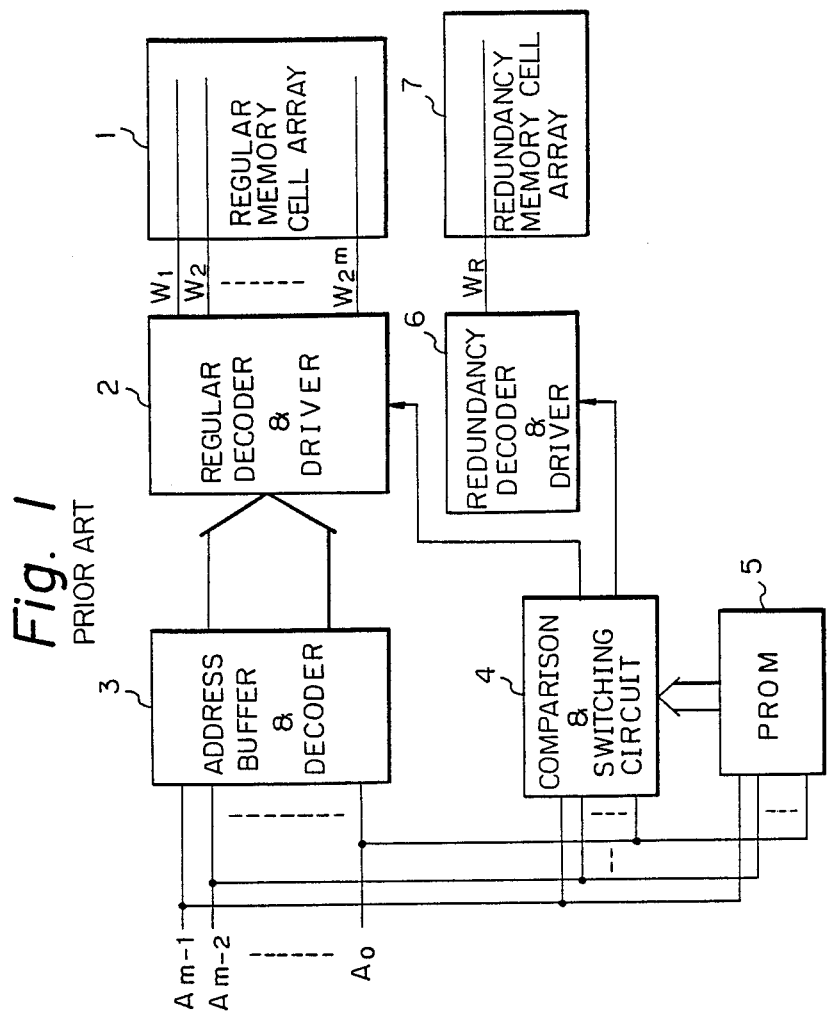
FIG. 1 is a block diagram of a conventional semiconductor memory device having a redundancy memory cell array.

To clarify the background of the present invention, an example of a fundamental conventional semiconductor memory device having a redundancy memory cell array is shown in FIG. 1. As shown in FIG. 1, the memory device includes a regular memory cell array 1, a regular decoder and driver 2, an address buffer and decoder 3, a comparison and switching circuit 4, a programmable read only memory (PROM) 5, a redundancy decoder and driver 6, and the redundancy memory cell array 7. If a defective memory cell is detected by carrying out the test for the regular memory cell array 1 during the production process of the memory device, all address bit signals (for example, row address bit signals) constructing the address data corresponding to the defective memory cell are preliminarily programmed in the PROM 5.

Thus, when predetermined address bit signals (in this case, row address bit signals) $A_0$ to $A_{m-1}$ are input to the address buffer and decoder 3 in order to carry out a write operation or read operation, the input address bit signals are compared with the above programmed address bit signals in order to detect whether or not each logic of the corresponding address bit signal coincides, by using the comparison and switching circuit 4. As a result of the above comparison, if it is detected that at least one logic of the input address bit signals does not coincide with that of the corresponding programmed address bit signal (i.e., the input address data does not coincide with the address data of the defective memory cell), the regular decoder and driver 2 carries out the decoding operation in accordance with the input row address bit signals $A_0$ to $A_{m-1}$ supplied through the address buffer and decoder 3. As a result, a predetermined word line is selected in accordance with the input row address bit signals from a plurality of word lines $W_1$ to $W_{2m}$ arranged in the regular memory cell array 1 through the regular decoder and driver 2.

Conversely, if it is detected that each logic of the input address bit signal coincides with that of the corresponding programmed address bit signal (i.e., the input address data coincides with the address data of the defective memory cell), the comparison and switching circuit 4 outputs the control signal to inhibit the decoding operation of the regular decoder and driver 2 and to enter the redundancy decoder and driver 6 into an active state. As a result, a redundancy word line $W_R$ arranged in the redundancy memory cell array 7 is selected through the redundancy decoder and driver 6, instead of the predetermined word line corresponding to the input row address bit signals arranged in the regular memory cell array 1.

FIG. 2 is a detailed circuit diagram of the conventional semiconductor memory device in FIG. 1 having the redundancy memory cell array. In FIG. 2, in the memory device, only two row address bit signals $A_0 A_1$ are input as shown, to simplify the explanation.

Figure 2A:
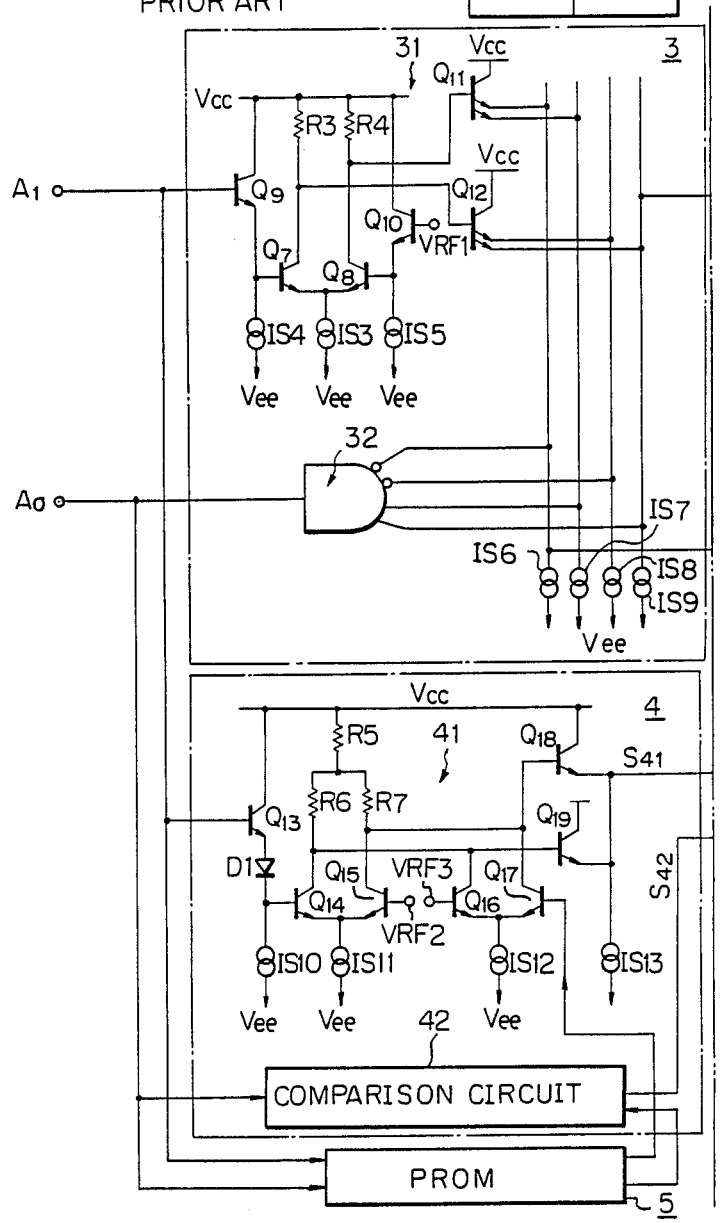
FIG. 2 comprised of FIGS. 2A and 2B is a circuit diagram of the conventional semiconductor memory device in FIG. 1 having the redundancy memory cell array.
Figure 2B:
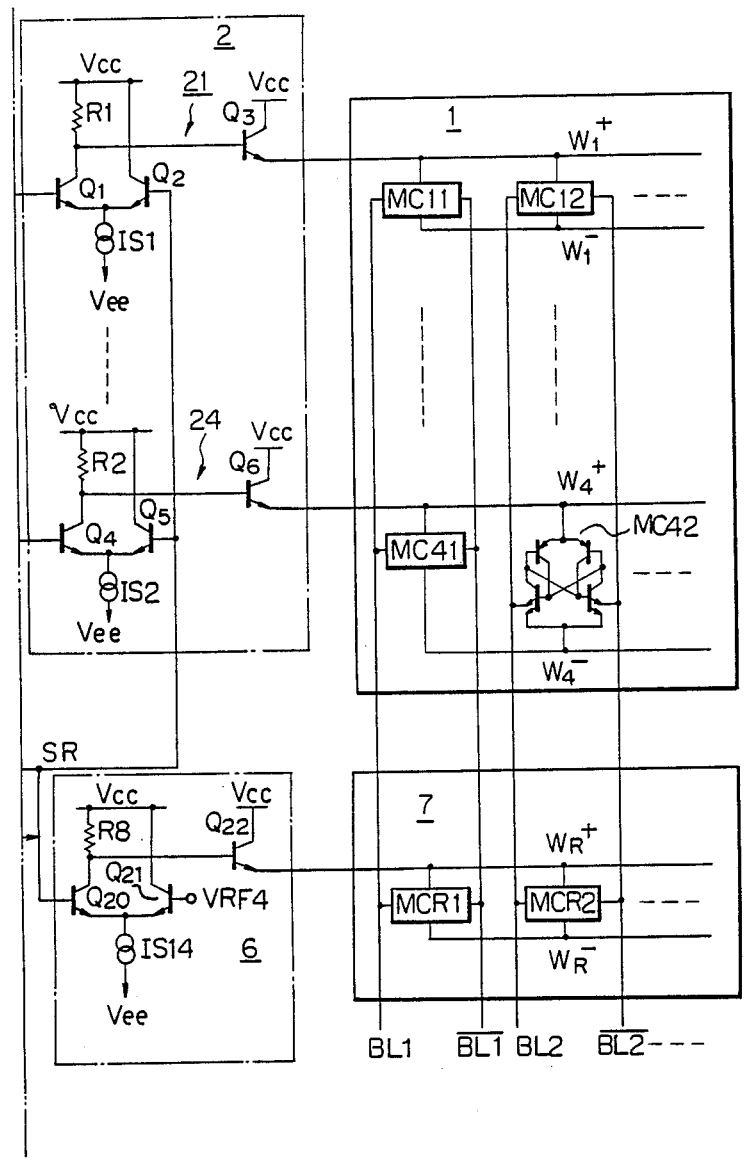

In FIG. 2 (including FIGS. 2A and 2B), the address buffer and decoder 3 comprises two address buffers 31, 32 and four (i.e., equal to $2^2$) decoder lines 3'. In the address buffer 31, when the potential of the input address bit signal $A_1$ is high (i.e., "1"), a transistor Q9 having a base to which the address bit signal $A_1$ is input turns ON, and further, a transistor Q7 turns ON. Conversely, a transistor Q10 having a base to which a reference potential (i.e., intermediate potential between high potential and low potential of the input address bit signal) VRF1 is supplied turns OFF, and further, a transistor Q8 turns OFF. Thus, the potential supplied to a base of a transistor Q12 becomes low due to the voltage drop produced in a resistor R3, and as a result, a predetermined low potential is supplied through each of the emitters of the transistor Q12 to two predetermined decoder lines 3'. On the other hand, the potential supplied to a base of a transistor Q11 becomes high (Vcc level), and as a result, a predetermined high potential is supplied through each of the emitters of the transistor Q11 to two predetermined decoder lines 3'. In this connection, Vcc shows a predetermined high potential (for example, ground potential), and Vee shows a predetermined low potential (for example, negative potential). Also IS3 to IS5 provided in the address buffer 31 and IS6 to IS9 provided in the decoder lines 3', are constant current sources. When the potential of the input address bit signal $A_1$ is low (i.e., "0"), the transistors Q10 and Q8 turn ON, and the transistors Q9 and Q7 turn OFF. As a result, a predetermined high potential is supplied through each of the emitters of the transistor Q12 to two predetermined decoder lines 3', and a predetermined low potential is supplied through each of the emitters of the transistor Q11 to two predetermined decoder lines 3'.

The address buffer 32, to which the address bit signal $A_0$ is input, similarly operates, and the predetermined high potential or low potential is supplied to each of the decoder lines 3' in accordance with the potential of the input address bit signal $A_0$, as shown in FIG. 2. Thus, only the potential of a predetermined decoder line to which the above low potential is supplied from both of the address buffers 31 and 32 becomes low level, and the potentials of the remaining decoder lines become high level.

The comparison and switching circuit 4 includes two comparison circuits 41 and 42, and each potential of the input address bit signals $A_0$ and $A_1$ is compared with that of the corresponding address bit signal programmed in the PROM 5 by using the comparison circuits 41 and 42. Considering the case in which the potential of the address bit signal $A_0$ does not coincide with that of the corresponding address bit signal programmed in the PROM 5. If the potential of the address bit signal $A_0$ is high (i.e., "1") while the potential of the corresponding address bit signal programmed in the PROM 5 is low (i.e., "0"), for example, a transistor Q13 having a base to which the high potential signal $A_0$ is input turns ON, and further, a transistor Q14 turns ON (in this case, a transistor Q15 having a base to which a reference potential VRF2 is supplied turns OFF). On the other hand, a transistor Q17 having a base to which the low potential programmed signal is supplied turns OFF, and a transistor Q16 having a base to which a reference potential VRF3 is supplied turns ON. Thus, although the potential supplied to a base of a transistor Q19 becomes low due to the voltage drop produced in the resistors R5 and R6, the potential supplied to a base of a transistor Q18 becomes high (i.e., equal to Vcc level), and as a result, a transistor Q18 turns ON, and therefore, the output potential $S_{41}$ of the comparison circuit 41 becomes high level. Similarly, if the potential of the address bit signal $A_0$ is low (i.e., "0") and the potential of the corresponding address bit signal programmed in the PROM 5 is high (i.e., "1"), a transistor Q19 turns ON, and therefore, the output potential $S_{41}$ of the comparison circuit 41 also becomes high level. In this connection, IS10 to IS13 provided in the comparison circuit 41 are constant current sources. Also, if the potential of the address bit signal $A_1$ does not coincide with that of the corresponding address bit signal programmed in the PROM 5, the output potential $S_{42}$ of the comparison circuit 42 becomes high level. Thus, the high level switching signal SR is supplied to each base of transistors Q2 to Q5 provided in each of the decoders (in this case, four decoders) 21 to 24 (see FIG. 2B) arranged in the regular decoder and driver 2 and a base of a transistor Q20 provided in the redundancy decoder and driver 6. As a result, in the redundancy decoder and driver 6, the transistor Q20 turns ON and the potential supplied to a base of a drive transistor Q22 becomes low due to the voltage drop produced in a resistor R8, and thus, the redundancy decoder and driver 6 does not supply the selection signal to the redundancy memory cell array 7. On the other hand, the above high level potential of the switching signal SR supplied to each base of the transistors Q2 to Q5 provided in each of the regular decoders 21 to 24 functions as a reference potential.

Thus, in the regular decoder and driver 2, if, for example, the potential of the decoder line connected to a transistor Q1 provided in the regular decoder 21 becomes low in accordance with the potentials of the row address bit signals $A_0$ and $A_1$, the transistor Q1 turns OFF and the transistor Q2 turns ON. Thus, the potential supplied to a base of a drive transistor Q3 becomes high (i.e., equal to Vcc level), and a high level selection signal is supplied through an emitter of the drive transistor Q3 to a word line $W_1^+$. The memory cells MC11, MC12, ... connected between a pair of word lines $W_1^+$ and $W_1^-$ provided in the regular memory cell array 1 are selected in accordance with the potentials of the input row address bit signals $A_0$ and $A_1$. In this case, the potential of the decoder line connected to a transistor (for example, transistor Q4) provided in the other regular decoder (for example the regular decoder 24) becomes high level. Thus, the transistor Q4 turns ON and the potential supplied to a base of a drive transistor Q6 becomes low due to the voltage drop produced in a resistor R2. As a result, other word lines except for the above word line $W_1^+$ (for example, the word line $W_4^+$) are non-selected. In this connection, each of the memory cells MC11, MC12, ... is constructed as a flip-flop circuit connected between a pair of word lines $W_1^+$ and $W_1^-$, and so on, and between a pair of bit lines BL1 and $\overline{BL1}$, and so on. The flip-flop circuit constructing the memory cell can be formed, for example, as shown to in the memory cell MC42.

Next, considering the case in which each potential of the input row address bit signals $A_0$ and $A_1$ coincides with that of the corresponding address bit signal programmed in the PROM 5 (i.e., the input row address data corresponds to the row address data of the defective memory cell), if both potentials of the address bit signal $A_0$ and the corresponding bit signal programmed in the PROM 5 are high (i.e., "1"), for example, the transistors Q13 and Q14 turn ON, while the transistor Q15 turns OFF. Thus the potential supplied to the base of the transistor Q19 becomes low due to the voltage drop produced in the resistors R5 and R6. Further, the transistor Q17 turns ON while the transistor Q16 turns OFF, and thus the potential supplied to the base of the transistor Q18 also becomes low due to the voltage drop produced in the resistors R5 and R7. Both transistors Q18 and Q19 turn OFF, and as a result, the output potential $S_{41}$ of the comparison circuit 41 becomes low. Similarly, if both potentials of the address bit signal $A_0$ and the corresponding bit signal programmed in the PROM 5 are low (i.e., "0"), the transistor Q15 turns ON while the transistors Q13 and Q14 turn OFF. Thus, the potential supplied to the base of the transistor Q18 becomes low. Further, the transistor Q16 turns ON while the transistor Q17 turns OFF, and thus the potential supplied to the base of the transistor Q19 becomes low. As a result, both transistors Q18 and Q19 turn OFF, and the output potential $S_{41}$ of the comparison circuit 41 becomes low. Also, if the potential of the address bit signal $A_1$ coincides with that of the corresponding address bit signal programmed in the PROM 5, the output potential $S_{42}$ of the comparison circuit 42 becomes low.

Thus, the switching signal SR having the predetermined low level is supplied to each base of the transistors Q2 to Q5 provided in each of the decoders 21 to 24 arranged in the regular decoder and driver 2 and the base of the transistor Q20 provided in the redundancy decoder and driver 6. As a result, in the regular decoders 21 to 24, all transistors Q1 to Q4 having the base connected to the predetermined decoder line 3 turn ON, and the potential supplied to each base of all of the drive transistors Q3 to Q6 becomes low, and thus all of the word lines $W_1^+$ to $W_4^+$ provided in the regular memory cell array 1 are non-selected. Conversely, in the redundancy decoder and driver 6, the transistor Q20 turns OFF while the transistor Q21 turns ON, having a base to which a reference voltage VRF4 is supplied. Thus, the potential supplied to the base of the drive transistor Q22 becomes high, and a high level selection signal is supplied through an emitter of the drive transistor Q22 to a redundancy word line $W_R^+$. Thus the redundancy memory cells MCR1, MCR2, ... connected between a pair of redundancy word lines $W_R^+$ and $W_R^-$ provided in the redundancy memory cell array 7 are selected instead of the regular memory cells corresponding to the row address data programmed in the PROM 5. In this connection, IS1 to IS2 provided in each of the regular decoders 21 to 24 and IS14 provided in the redundancy decoder and driver 6 are constant current sources.

As above-mentioned, in the above conventional memory device shown in FIG. 2, it is only possible to select one redundancy word line $W_R+$ instead of one word line to which the defective memory cell is connected by providing the programmable read only memory (PROM) in which all address bit signals constructing the row address data corresponding to the above defective memory cell are programmed. Therefore, if it is desired to increase the number of the redundancy word lines in order to prevent the selection of each of several word lines to which a number of defective memory cells are connected, it is necessary to increase the number of the PROMs. In the PROMs, all address bit signals constructing a plurality of row address data corresponding to the defective memory cells are programmed. In additions, it is necessary to increase the number of comparison circuits for comparing each logic of the input address bit signals with that of the corresponding programmed address bit signal. Thus, a problem arises in that the total capacity of the increased PROMs becomes large, and accordingly, the entire structure of the increased comparison circuits also becomes large, particularly when the number of the address bit signals constructing each address data is increased. Further, the number of the redundancy word lines or redundancy bit lines to be selected instead of the regular word lines or regular bit lines to which the defective memory cells are connected is increased.

The present invention solves the above problem. FIG. 3 is a semiconductor memory device having a redundancy memory cell array according to the present invention. The same reference numerals as in FIG. 1 are given to each of the corresponding circuit portions shown in FIG. 3. As shown in FIG. 3, when predetermined address bit signals (in this case, row address bit signals) $A_0$ to $A_{m-1}$ are input to the address buffer and decoder 3, one or more upper address bit signals input thereto (in this case, upper address bit signals $A_k$ to $A_{m-1}$) are compared with upper address bit signals programmed in the PROM 5 as the upper address bit signals included in the row address data corresponding to each of the defective memory cells. Then it is detected whether or not each logic of the corresponding upper address bit signal coincides, by using the comparison and switching circuit 4. As a result of the above comparison, if it is detected that at least one logic of the input upper address bit signals does not coincide with that of the corresponding programmed upper address bit signal, the regular decoder and driver 2 carries out the decoding operation in accordance with the input row address bit signals $A_0$ to $A_{m-1}$ including the above upper address bit signals $A_k$ to $A_{m-1}$ and the lower address bit signals $A_0$ to $A_{k-1}$ supplied through the address buffer and decoder 3. As a result, a predetermined word line is selected in accordance with the input row address bit signals $A_0$ to $A_{m-1}$ from word lines $W_1$ to $W_{2m}$ arranged in the regular memory cell array 1 through the regular decoder and driver 2.

Conversely, if it is detected that each logic of the input upper address bit signals coincides with that of the corresponding programmed upper address bit signal, the comparison and switching circuit 4 outputs the control signal to inhibit the decoding operation of the regular decoder and driver 2 and to place the redundancy decoder and driver 6 into an active state. As a result, a predetermined redundancy word line is selected in accordance with the input lower address bit signals $A_0$ to $A_{k-1}$ from a plurality of redundancy word lines $W_{R1}$ to $R_{R2k}$ arranged in the redundancy memory cell array 7 through the redundancy decoder and driver 6, instead of the predetermined word line corresponding to the input row address bit signals $A_0$ to $A_{m-1}$ arranged in the regular memory cell array 1.

Figure 4B:
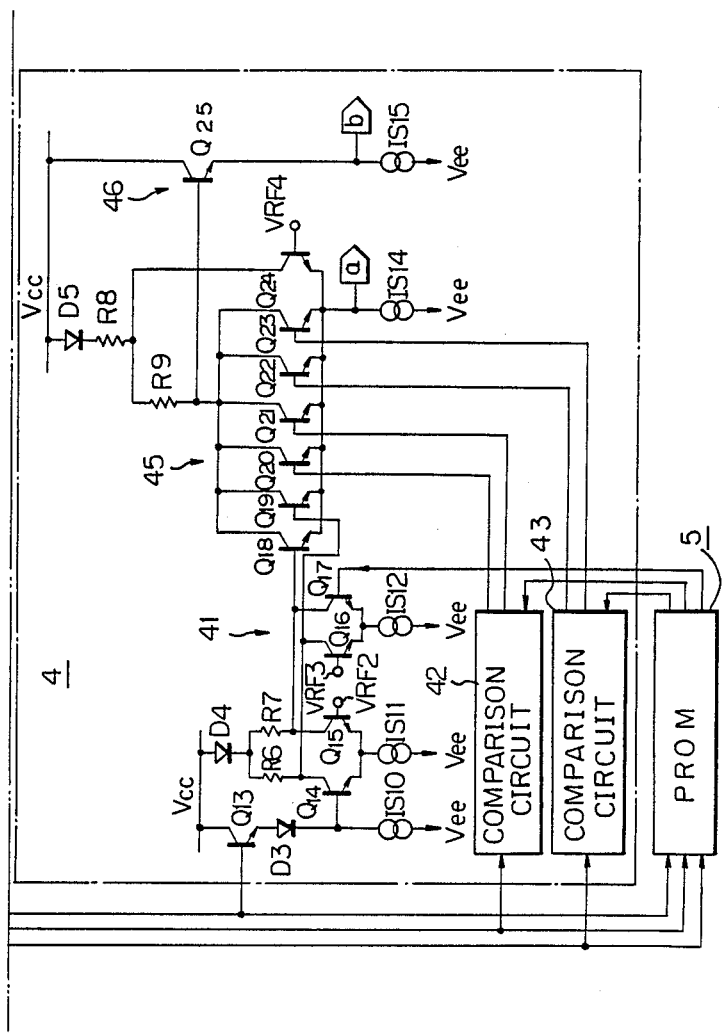
FIG. 4 made up of FIGS. 4A and 4B is a circuit diagram of a first embodiment of the semiconductor memory device in FIG. 3 according to the present invention.

FIG. 4 (including FIGS. 4A and FIG. 4B) a detailed circuit diagram the semiconductor memory device having the redundancy memory cell array according to the present invention. In FIG. 4, the memory device to which five row address bit signals $A_0$ to $A_4$ are input is exemplified. In this embodiment, three address bit signals $A_2$ to $A_4$ function as upper address bits, and two address bit signals $A_0$ to $A_1$ function as lower address bits.

If defective memory cells are detected by carrying out the test for the regular memory cell array, the upper address bit signals included in each of the address data corresponding to the defective memory cells are preliminarily programmed in the PROM 5.

Also, the address buffer and decoder 3 comprises three address buffers 31 to 33, to each of which the above upper address bits $A_2$ to $A_4$ are input, and two address buffers 34 to 35 to each of which the above lower address bits $A_0$ to $A_1$ are input, and twelve (i.e., eight plus four) decoder lines 3A and 3B. The decoder lines 3A and 3B function as a predecoder and include first predecoder lines 3A (eight decoder lines) and second predecoder lines 3B (four decoder lines). The operations of the address buffers 31 to 35 are similar to those of the address buffers 31 to 32 shown in FIG. 2. For example, in the address buffer 31, when the potential of the input upper address signal $A_4$ is high, a transistor Q7 turns ON through a diode D2 and a constant current source IS4, and further, a transistor Q5 turns ON through a diode D1, a resistor R2, and a constant current source IS3. Conversely, a transistor Q6 turns OFF, and thus the potential supplied to a base of a transistor Q11 becomes low. As a result, a predetermined low potential is supplied through each of the emitters of the transistor Q11 to four predetermined decoder lines 3A. On the other hand, the potential supplied to a base of a transistor Q12 becomes high, and as a result, a predetermined high potential is supplied through each of the emitters of the transistor Q12 to four predetermined decoder lines 3A. Also, when the potential of the input upper address bit signal $A_4$ is low, the transistors Q7 and Q5 turn OFF, and the transistor Q6 turns ON. As a result, a predetermined high potential is supplied through each of the emitters of the transistor Q11 to four predetermined decoder lines 3A, and a predetermined low potential is supplied through each of the emitters of the transistor Q12 to four predetermined decoder lines 3A. The address buffer 32 to which the upper address bit signal A3 is input and the address buffer 33 to which the upper addres bit signal A2 is input similarly operate. That is, the predetermined high potential or low potential is supplied from each of the address buffers 31 to 33 to each of the decoder lines 3A in accordance with the potential of the corresponding input upper address bit signal. Thus, only the potential of a predetermined decoder line 3A to which the above low potential is supplied from all of the above three address buffers 31 to 33 becomes low level, and the potentials of remaining decoder lines 3A become high level.

Further, the address buffer 34 to which the lower address bit signal $A_1$ is input and the address buffer 35 to which the lower address, bit signal $A_0$ is input similarly operates. That is, predetermined high potential or low potential is supplied from each of the address buffers 34 and 35 to each of the decoder lines 3B in accordance with the potential of the corresponding input lower address bit signal. Thus, only the potential of a predetermined decoder line 3B to which the above low potential is supplied from both of the above two address buffers 34 and 35 becomes low level, and the potentials of the remaining decoder lines 3B become high level.

The comparison and switching circuit 4 includes three comparison circuits 41 to 43, and each potential of the input upper address bit signals $A_2$ to $A_4$ is compared with that of the corresponding upper address bit signal programmed in the PROM 5. The operation of each of the comparison circuits 41 to 43 is similar to that of the comparison circuit 41 shown in FIG. 2, where D3 and D4 are diodes.

If the potential of the input upper address bit signal $A_4$ does not coincide with that of the corresponding upper address bit signal programmed in the PROM 5, the potential supplied to the base of the transistor Q18 or the potential supplied to the base of the transistor Q19 becomes high. Thus, the transistor Q18 or Q19 turns ON. Similarly, if the potential of the input upper address bit signal $A_3$ does not coincide with that of the corresponding upper address bit signal programmed in the PROM 5, the transistor Q20 or Q21 turns ON. Further, if the potential of the input upper address bit signal $A_2$ does not coincide with that of the corresponding upper address bit signal programmed in the PROM 5, the transistor Q22 or Q23 turns ON. The transistors Q18 to Q23 are connected in parallel with each other (i.e., function as the OR circuit 45), and as above-mentioned, if at least one potential of the input upper address bit signals (in this case, $A_2$ to $A_4$) does not coincide with that of the corresponding programmed upper address bit signal, at least one of the transistors Q18 to Q23 turns ON through a diode D5, a resistor R8, R9 and a constant current source IS14. Thus, the potential of a point "a" connected to each emitter of the transistors Q18 to Q23 becomes high in accordance with the high potential supplied to the base of at least one of the transistors Q18 to Q23, which turn ON. Conversely, the potential supplied to a base of a transistor Q25 constructing the emitter follower 46 becomes low due to the voltage drop produced in the resistors R8 and R9, and thus the potential of a point "b" connected to an emitter of the transistor Q25 becomes low. In this case, a transistor Q24 having a base to which a reference potential VRF4 is supplied turns OFF.

The regular decoder and driver 2 comprises regular decoders 21 to 232.

The regular decoder 21 comprises a transistor Q1 having a base connected to a predetermined decoder line selected from four decoder lines 3B, a transistor Q2 having a base connected to a predetermined decoder line selected from eight decoder lines 3A, and a transistor Q3 having a base connected to the above point "a" in the comparison and switching circuit 4. Transistor Q4 corresponds to a drive transistor and IS1 shows a constant current source. The construction of the other regular decoders 22 to 232 are similar to that of the regular decoder 21. The regular decoders 21 to 232 function as postdecoders.

The redundancy decoder and driver 6 comprises redundancy decoders 61 to 64. The redundancy decoder 61 comprises a transistor Q26 having a base connected to a predetermined decoder line selected from four decoder lines 3B, and a transistor Q27 having a base connected to the above point "b" in the comparison and switching circuit 4. Transistor Q28 corresponds to a drive transistor and IS16 is a constant current source. The construction of the other redundancy decoders 62 to 64 are similar to that of the redundancy decoder 61.

Figure 5A:
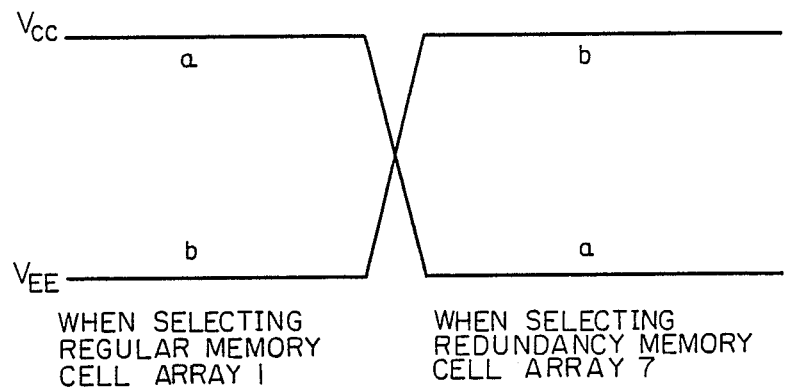
FIG. 5A and FIG. 5B are diagrams of the potential levels at portions in the circuit shown in FIG. 4.

As above-mentioned, when at least one potential of the input upper address bit signals (in this case, $A_2$ to $A_4$) does not coincide with that of the corresponding programmed upper address bit signal, the potential of the above point "a" becomes high, and the potential of the above point "b" becomes low, as shown in the left portion of FIG. 5A.

As a result, in the redundancy decoder 61, for example, since the transistor Q27 turns OFF and the transistor Q26 turns ON, the potential supplied to a base of the drive transistor Q28 becomes low due to the voltage drop produced in a resistor R10. The potential of the redundancy word line $W_{R1}+$ becomes low through an emitter of the drive transistor Q28, and the redundancy word line $W_{R1}+$ is non-selected. Similarly, all other redundancy word lines provided in the redundancy memory cell array 7 are also non-selected. On the other hand, the above high level potential of the point "a" supplied to each base of each transistor Q3 and the corresponding transistors provided in each of the regular decoders 21 to 232 functions as a reference potential.

Thus, in the regular decoder and driver 2, if, for example, both the potential of the decoder line 3B connected to the base of the transistor Q1 and the potential of the decoder line 3A connected to the base of the transistor Q2 provided in the regular decoder 21 become low in accordance with each potential of the input row address bit signals $A_0$ to $A_4$ including upper and lower address bit signals, the transistors Q1 and Q2 turn OFF. In addition, the transistor Q3 turns ON, the potential supplied to a base of the drive transistor Q4 becomes high, and a high level selection signal is supplied through an emitter of the drive transistor Q4 to a word line $W_1+$. Thus, the memory cells MC11, MC12, . . . connected between a pair of word lines $W_1+$ and $W_1-$ provided in the regular memory cell array 1 are selected in accordance with each potential of the input row address bit signals $A_0$ to $A_4$. In this case, at least one of the potentials of the first decoder line 3A and the second decoder line 3B connected to each of two transistors provided in the other regular decoders becomes high level, and as a result, the other word lines, except for the above word line $W_1+$, are non-selected.

Next, if each potential of the input upper address bit signals $A_2$ to $A_4$ coincides with that of the corresponding upper address bit signal programmed in the PROM 5, all potentials supplied from each of the comparison circuits 41, 42, and 43 to each base of the transistors Q18 to Q23 become low. Thus, all transistors Q18 to Q23 turn OFF and the transistor Q24 turns ON. Thus, the potential of the point "a" connected to an emitter of the transistor Q24 becomes low, and the potential supplied to the base of the transistor Q25 becomes high. In addition, the potential of the point "b" connected to the emitter of the transistor Q25 becomes high, as shown in the right portion in FIG. 5A.

As a result, the above low level potential of the point "a" is supplied to each base of the transistor Q3 and the corresponding transistors provided in each of the regular decoders 21 to 232. Thus, in the regular decoders 21 to 232, all transistors (for example, Q1 and Q2) connected to each of the decoder lines 3A and 3B turn ON, and the potential supplied to each base of all drive transistors (for example, Q4) becomes low. Therefore, all word lines (for example, $W_1+$) provided in the regular memory cell array 1 are non-selected.

Figure 5B:
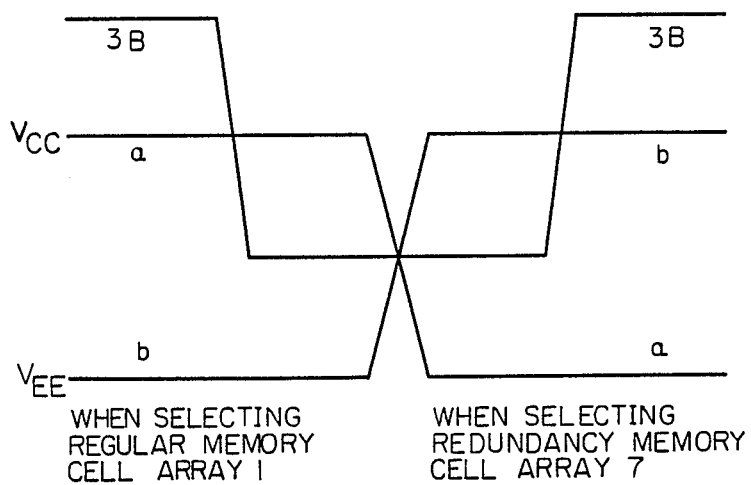

Contrary to this, in the redundancy decoder and driver 6, the high level potential of the point "b" is supplied to each base of each transistor Q27 and the corresponding transistors provided in each of the redundancy decoders 61 to 64. Therefore, in the redundancy decoders 61 to 64, a predetermined transistor (for example, Q26) having a base connected to the predetermined decoder line 3B having a predetermined low level potential to which decoder line the low level potential is supplied from both of the two address buffers 34 and 35 turns OFF. In addition, the potential supplied to the base and the emitter of the drive transistor (for example, Q28) becomes high, and as a result, a predetermined redundancy word line (for example, $W_{R1}+$) is selected in accordance with each potential of the input lower address bit signals $A_0$ and $A_1$. FIG. 5B shows the relationship between the high potential level and the low potential level of the decoder lines 3B, at the above points "a" and "b". The left portion of FIG. 5B shows the relationship when a predetermined word line provided in the regular memory cell array 1 is selected, and the right portion of FIG. 5B shows the relationship when a predetermined word line provided in the redundancy memory cell array 7 is selected.

In the embodiment shown in FIG. 4, four redundancy word lines are provided in the redundancy memory cell array 7. When each potential of the input upper address bit signals $A_2$ to $A_4$ coincides with that of the corresponding upper address bit signal programmed in the PROM 5, one of the above four redundancy word lines is selected in accordance with each potential of the input lower address bit signals $A_0$ and $A_1$, instead of the regular word line corresponding to the input word address data $A_0$ to $A_4$ (to which the defective memory cell is connected). Thus, it is possible to select one of the above four redundancy word lines instead of each of the predetermined four word lines arranged to be adjacent to each other in one of the memory cell blocks 11 to 18 provided in the regular memory cell array 1. In this case, it is particularly effective to prevent the selection of each of the adjacent word lines or bit lines between which a short circuit exists due to for example, the production process. Further, it is also possible to select one of the above four redundancy word lines instead of all the predetermined four word lines to which the defective memory cells are connected. Each of the redundancy word lines is dispersively arranged in the regular memory cell array 1.

Figure 6B:
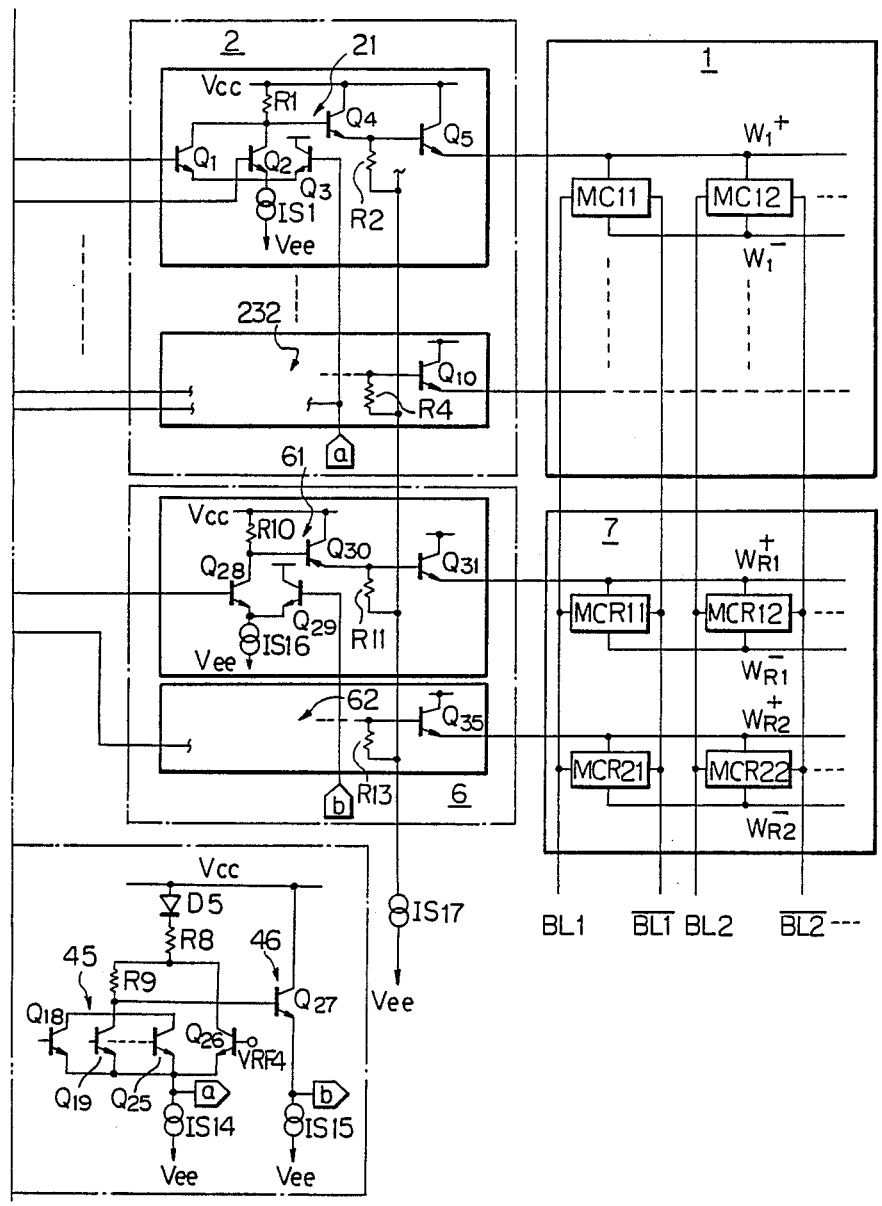
FIG. 6 composed of FIGS. 6A and 6B of a second is a circuit diagram embodiment of the semiconductor memory device according to the present invention.

FIG. 6 (which includes FIGS. 6A and 6B) is another embodiment of the semiconductor memory device having the redundancy memory cell array according to the present invention. In the memory device shown in FIG. 6, five row address bit signals $A_0$ to $A_4$ are also input to the memory device, and four address bit signals $A_1$ to $A_4$ function as upper address bits. Only one address bit signal $A_0$ functions as a lower address bit. The above upper address bit signals included in each of the address data corresponding to the defective memory cells are preliminarily programmed in the PROM 5.

The address buffer and decoder 3 includes the address buffer and decoder 30 for the regular memory cell array. The address buffer and decoder 30 includes five address buffers corresponding to the address buffers 31 to 35 shown in FIG. 4, and eight decoder lines (first predecoder) 3A and four decoder lines (second predecoder) 3B as shown in FIG. 4. Additionally, the address buffer and decoder 3 includes one more address buffer 36, to which the lower address bit $A_0$ is input.

The comparison and switching circuit 4 includes four comparison circuits 41 to 44, and each potential of the input upper address bit signals $A_1$ to $A_4$ is compared with that of the corresponding upper address bit signal programmed in the PROM 5. The operation of the comparison and switching circuit 4 shown in FIG. 6 is similar to that of the comparison and switching circuit 4 shown in FIG. 4.

Thus, if at least one potential of the input upper address bit signals (in this case, $A_1$ to $A_4$) does not coincide with that of the corresponding programmed upper address bit signal, at least one of the transistors Q18 to Q25 turns ON, and as a result, the potential of the point "a" connected to each emitter of the transistors Q18 to Q25 becomes high in accordance with the high potential supplied to a base of at least one of the transistors Q18 to Q25 which turns ON. Conversely, if the potential supplied to a base of a transistor Q27 constructing the emitter follower 46 becomes low, the potential of the point "b" connected to an emitter of the transistor Q27 becomes low.

The regular decoder and driver 2 comprises regular decoders 21 to 232. The regular decoder 21 comprises a transistor Q1 having a base connected to a predetermined decoder line selected from four decoder lines 3B as shown in FIG. 4, a transistor Q2 having a base connected to a predetermined decoder line selected from eight decoder lines 3A as shown in FIG. 4, and a transistor Q3 having a base connected to the above point "a" in the comparison and switching circuit 4. Further, a driver circuit is constructed by transistors Q4 and Q5 and a resistor R2. The constructions of the other regular decoders are similar to that of the regular decoder 21. The regular decoders 21 to 232 function as postdecoders, and the driver circuit as above-mentioned is connected to the output side of each of the regular decoders 21 to 232.

The redundancy decoder and driver 6 comprises two redundancy decoders 61 and 62. The redundancy decoder 61 comprises a transistor Q28 having a base connected to the output terminal of the address buffer 36. The potential at the output terminal becomes low when the potential of the lower address bit signal $A_0$ is high. The redundancy decoder 61 also includes a transistor Q29 having a base connected to the above point "b" in the comparison and switching circuit 4. The driver circuit connected to the output side of the redundancy decoder 61 is constructed by transistors Q30 and Q31 and a resistor R11. Similarly, the redundancy decoder 62 comprises a transistor (not shown) having a base connected to an output terminal of the address buffer 36. The potential at the output terminal becomes high when the potential of the lower address bit signal $A_0$ is high. The redundancy decoder 62 also includes a transistor (not shown) having a base connected to the above point "b". The driver circuit as above-mentioned is also connected to the output side of the redundancy decoder 62. In this connection, IS17 also shows a constant current source to which the above resistors R2, R11, and so on, are connected.

As a result, in the redundancy decoder 61, for example, since the potential of the point "b" is lower than the low level output potential of the address buffer 36, the transistor Q29 turns OFF and the transistor Q28 turns ON. The potential supplied to a base of the drive transistor Q30 becomes low due to the voltage drop produced in the resistor R10. Thus, the potential of the redundancy word line $W_{R1}+$ becomes low through the drive transistors Q30 and Q31, and therefore, the redundancy word line $W_{R1}+$ is non-selected. Similarly, another redundancy word line $W_{R2}+$ connected to another redundancy decoder 62 through the driver circuit is also non-selected. On the other hand, the above high level potential of the point "a" supplied to each base of the transistor Q3 and the corresponding transistors provided in each of the regular decoders 21 to 232 functions as a reference potential.

Thus, in the regular decoder and driver 2, if both the base potential of the transistor Q1 and the base potential of the transistor Q2 provided in the regular decoder 21 becomes low in accordance with each potential of the input row address bit signals $A_0$ to $A_4$, as above-mentioned regarding the embodiment shown in FIG. 4, the transistors Q1 and Q2 turn OFF and the transistor Q3 turns ON. Therefore, the potential supplied to the base of the drive transistor Q4 becomes high. As a result, a high level selection signal is supplied through the drive transistors Q4 and Q5, to the word line $W_1+$. Thus, the memory cells MC11, MC12 . . . connected between the pair of word lines $W_1+$ and $W_1-$ provided in the regular memory cell array 1 are selected in accordance with each potential of the input row address bit signals $A_0$ to $A_4$. In this case, the other word lines provided in the regular memory cell array 1 are non-selected, except for the above word line $W_1+$.

Next, if each potential of the input upper address bit signals $A_1$ to $A_4$ coincides with that of the corresponding upper address bit signal programmed in the PROM 5, all potentials supplied from each of the comparison circuits 41 to 44 to each base of the transistors Q18 to Q25 becomes low. Therefore, all the transistors Q18 to Q25 turn OFF, and a transistor Q26 to which a reference potential VRF4 is supplied turns ON. Thus, the potential of the point "a" connected to an emitter of the transistor Q26 becomes low, and the potential supplied to the base of the transistor Q27 becomes high, and the potential of the point "b" connected to the emitter of the transistor Q27 also becomes high.

As a result, the above low level potential of the point "a" is supplied to each base of the transistor Q3 and the corresponding transistors provided in each of the regular decoders 21 to 232. Thus, in the regular decoders 21 to 232, all the transistors (for example, Q1 and Q2) connected to each of the decoder lines, as shown in FIG. 4, turn ON, and the potential supplied to each base of all the drive transistors (for example, Q4) becomes low. Therefore, all the word lines (for example, $W_1+$) provided in the regular memory cell array 1 are non-selected.

Contrary to this, in the redundancy decoder and driver 6, the high level potential of the point "b" is supplied to each base of the transistor Q29 and the corresponding transistor provided in each of the redundancy decoders 61 and 62. Therefore, if the potential of the input lower address bit signal $A_0$ is high, the output potential of the address buffer 36 connected to the base of the transistor Q28 becomes low. Thus, the transistor Q28 turns OFF, and the high level potential is supplied to the base of the drive transistor Q30. As a result, the redundancy word line $W_{R1}+$ provided in the redundancy memory cell array 7 is selected through the drive transistors Q30 and Q31. On the other hand, if the potential of the input lower address bit signal $A_0$ is low, the output potential of the address buffer 36 connected to the base of the transistor provided in the redundancy decoder 62 and corresponding to the above transistor Q28 becomes low. As a result, through a similar operation, the redundancy word line $W_{R2}+$ provided in the redundancy memory cell array 7 is selected.

In the embodiment shown in FIG. 6, two redundancy word lines are provided in the redundancy memory cell array 7. When each potential of the input upper address bit signals $A_1$ to $A_4$ coincides with that of the corresponding upper address bit signal programmed in the PROM 5, one of the above two redundancy word lines is selected in accordance with the potential of the input lower address bit signal $A_0$, instead of the regular word line corresponding to the input word address data $A_0$ to $A_4$ to which the defective memory cell is connected.

As above-mentioned, not only is it possible to select one of the above two redundancy word lines instead of each of the predetermined two word lines arranged adjacent to each other in the regular memory cell array, but also it is possible to select one of the above two redundancy word lines instead of each of the predetermined two word lines to which the defective memory cells are connected. Each of the two word lines is separately arranged in the regular memory cell array. In this connection, as in the former case, this effectively prevents the selection of each of the adjacent two word lines or two bit lines between which a short circuit occurs during the production process, as above-mentioned.

Although, in the above-mentioned embodiments, a predetermined number of redundancy word lines are selected instead of one of several word lines to which the defective memory cells are connected, it is also possible to provide a predetermined number of redundancy bit lines to be selected instead of each of several bit lines to which the defective memory cells are connected.

Thus, according to the present invention, it is possible to provide a semiconductor memory device having a redundancy memory cell array in which a predetermined number of redundancy word lines or bit lines are selected instead of one of several regular word lines or bit lines to which the defective memory cells are connected, without making the capacity of the PROM and the entire structure of the comparison circuits large.

We claim:

1. A semiconductor memory device comprising:
   one or more upper address bit input terminals connected to receive one or more upper address bits;
   one or more lower address bit input terminals connected to receive one or more lower address bits;
   a regular memory cell array including:
      a plurality of word lines;
      a plurality of bit lines intersecting said word lines; and
      a plurality of memory cells arranged at the intersections of said word lines and bit lines and including a defective memory cell;
   a redundancy memory cell array including:

a plurality of word lines;

a plurality of bit lines intersecting said word lines; and a plurality of memory cells arranged at the intersections of said word lines and bit lines, the capacity of said redundancy memory cell array being less than the capacity of said regular memory cell array;

first selection means, connected to said upper and lower address bit input terminals and to said regular memory cell array, for selecting one of said word lines and bit lines in said regular memory cell array in accordance with said upper address bits and lower address bits;

second selection means, connected to said lower address bit input terminals and to said redundancy memory cell array, for selecting one of said word lines and bit lines in said redundancy memory cell array in accordance with said lower address bits;

redundancy address programming means, connected to said regular memory cell array, for programming one or more upper address bits of address data corresponding to the defective memory cell in said regular memory cell array; and control means, connected to said regular memory cell array and said redundancy memory cell array, for comparing each of said input upper address bits with each of said programmed upper address bits and for controlling said first and second selection means so that the selection of one of said word lines and bit lines in said regular memory cell array is inhibited and a predetermined one of said word lines and bit lines in said redundancy memory cell array is selected instead, when each of said input upper address bits coincides with each of said programmed upper address bits.

2. A semiconductor memory device according to claim 1, wherein said first selection means comprises:

first prestage decoder means, coupled to receive said input upper address bits, for decoding said input upper address bits and outputting an output signal;

second prestage decoder means, coupled to receive said input lower address bits, for decoding said input lower address bits and outputting an output signal; and poststage decoder means, coupled to said first and second prestage decoder means, for receiving and decoding the output signals from said first and second prestage decoder means; and wherein said second selection means comprises:

a circuit, coupled to said first selection means, for receiving the output signal from said second prestage decoder means and for selecting a predetermined one of said word lines and bit lines in said redundancy memory cell array.

3. A semiconductor memory device according to claim 2, wherein said control means is coupled to said poststage decoder means for comparing each of said input upper address bits with each of said programmed upper address bits, for outputting a control signal for inhibiting the decoding operation of said poststage decoder means and for placing said second selection means in an active state when each of said input upper address bits coincides with each of said programmed upper address bits.

4. A semiconductor memory device according to claim 1, wherein said first selection means comprises first decoder means, coupled to said regular memory cell array, for decoding said input upper address bits and said input lower address bits, and wherein said second selection means comprises second decoder means, coupled to said redundancy memory cell array, for decoding said input lower address bits.

5. A semiconductor memory device according to claim 4, wherein said control means is coupled to said first and second decoder means for comparing each of said input upper address bits and outputting the control signal, for inhibiting the decoding operation of said first decoder means and for placing said second decoder means in an active state when each of said input upper address bits coincides with each of said programmed upper address bits.

* * * * *

UNITED STATES PATENT AND TRADEMARK OFFICE
CERTIFICATE OF CORRECTION

PATENT NO. : 4,757,474

DATED : JULY 12, 1988

INVENTOR(S) : ISAO FUKUSHI ET AL.

It is certified that error appears in the above-identified patent and that said Letters Patent is hereby corrected as shown below:

Col. 3, line 26, delete "of a second";
       line 27, after "diagram" insert --of a second--.

Col. 4, line 19, "$A_0A_1$" should be --$A_0$ and $A_1$--.

Col. 5, line 51, delete "the" and insert --for--. (2nd occurr.)

Col. 6, line 10, delete "to";
       line 11, delete "shown".

Col. 8, line 9, after "FIG. 4B)" insert --is--;
       line 58, "addres" should be --address--.

Col. 9, line 4, after "is," insert --the--.

Signed and Sealed this

Twenty-ninth Day of November, 1988

Attest:

DONALD J. QUIGG

Attesting Officer

Commissioner of Patents and Trademarks